United States Patent
Sakamoto

(10) Patent No.: US 8,934,508 B2
(45) Date of Patent: Jan. 13, 2015

(54) OPTICAL FIBER-TYPE OPTICAL ELEMENT, LASER DIODE MODULE, AND FIBER LASER

(71) Applicant: Shinichi Sakamoto, Sakura (JP)

(72) Inventor: Shinichi Sakamoto, Sakura (JP)

(73) Assignee: Fujikura Ltd., Koto-ku, Tokyo ( * ) Notice: Subject to any disclaimer, the term of this patent is extended or adjusted under 35 U.S.C. 154(b) by 0 days.

(21) Appl. No.: 13/622,822

(22) Filed: Sep. 19, 2012

(65) Prior Publication Data

US 2013/0016742 A1 Jan. 17, 2013

Related U.S. Application Data

(63) Continuation of application No. PCT/JP2011/053331, filed on Feb. 17, 2011.

(30) Foreign Application Priority Data

Mar. 23, 2010 (JP) ................................ 2010-065990

(51) Int. Cl.
   *H01S 3/067* (2006.01)
   *G02B 6/34* (2006.01)

(52) U.S. Cl.
   USPC ................................ 372/6; 385/29; 385/127

(58) Field of Classification Search
   CPC . H01S 3/067; H01S 3/06708; H01S 3/06733; H01S 3/0675; H01S 3/06754; H01S 3/094003; H01S 3/094007; H01S 5/147
   USPC ......................................... 372/6; 385/29, 127
   See application file for complete search history.

(56) References Cited

U.S. PATENT DOCUMENTS

| 6,104,852 | A | 8/2000 | Kashyap |
| 6,842,566 | B2 * | 1/2005 | Ishikawa et al. ................. 385/37 |
| 7,440,176 | B2 * | 10/2008 | Fidric ........................... 359/341.3 |
| 2002/0159736 | A1 * | 10/2002 | Dejneka et al. ................ 385/127 |
| 2004/0151467 | A1 | 8/2004 | Ishikawa et al. |
| 2006/0093012 | A1 * | 5/2006 | Singh et al. ..................... 372/102 |
| 2007/0217738 | A1 * | 9/2007 | Anderegg et al. ................ 385/29 |

(Continued)

FOREIGN PATENT DOCUMENTS

| CN | 1407357 A | 4/2003 |
| CN | 1476541 A | 2/2004 |

(Continued)

OTHER PUBLICATIONS

Japanese Office Action dated May 21, 2013, issued in Japanese Patent Application No. 2012-506884.

(Continued)

*Primary Examiner* — Julio J Maldonado
*Assistant Examiner* — Michael Carter
(74) *Attorney, Agent, or Firm* — Sughrue Mion, PLLC

(57) ABSTRACT

There are provided: a core section provided so as to extend in a light-guiding direction in which incident light propagates; a photosensitive layer provided so as to extend in the light-guiding direction and peripherally enclose the core section, the photosensitive layer including a grating formed therein by irradiation of ultraviolet light having a predetermined wavelength; and a first cladding section provided between the core section and the photosensitive layer, the first cladding section having a lower refractive index than the core section and a lower photosensitivity than the photosensitive layer, the photosensitivity being a property in which a refractive index changes in response to irradiation with the ultraviolet light.

8 Claims, 7 Drawing Sheets

(56) References Cited

U.S. PATENT DOCUMENTS

| | | |
|---|---|---|
| 2008/0193093 A1 | 8/2008 | DiGiovanni et al. |
| 2009/0016681 A1 | 1/2009 | DiGiovanni |
| 2009/0067795 A1 | 3/2009 | DiGiovanni et al. |
| 2009/0169162 A1 | 7/2009 | Kumkar et al. |

FOREIGN PATENT DOCUMENTS

| | | |
|---|---|---|
| JP | 2001-15841 A | 1/2001 |
| JP | 2001-21772 A | 1/2001 |
| JP | 2003-167137 A | 6/2003 |
| JP | 2008-158094 A | 7/2008 |
| JP | 2008-199025 A | 8/2008 |
| JP | 2009-282468 A | 12/2009 |
| WO | 97/26571 A2 | 7/1997 |
| WO | 03/093887 A1 | 11/2003 |

OTHER PUBLICATIONS

Office Action for Chinese Patent Application No. 2011/80014752.8 dated Mar. 21, 2014.
Office Action dated Jul. 30, 2014 issued by the State Intellectual Property of the People's Republic of China in counterpart Chinese Patent Application No. 201180014752.8.

\* cited by examiner

OPTICAL FIBER-TYPE OPTICAL ELEMENT, LASER DIODE MODULE, AND FIBER LASER

This application is a Continuation of PCT International Application No. PCT/JP2011/053331 filed in Japan on Feb. 17, 2011, which claims the benefit of Patent Application No. 2010-065990 filed in Japan on Mar. 23, 2010, the entire contents of which are hereby incorporated by reference.

TECHNICAL FIELD

The present invention relates to an optical fiber-type optical element and, in particular, to an optical fiber-type optical element related to an optical fiber grating, and a laser diode module and a fiber laser, each of which includes the optical fiber-type optical element.

BACKGROUND ART

Active development has been recently carried out for laser diode modules based on a high power laser diode (LD).

A conventional LD module primarily includes a LD and a lensed fiber. A lensed fiber is an optical fiber, one of end faces of which is shaped like a lens (hereinafter, a "lens section"). The lensed fiber converges laser light emitted from the LD onto a core section by means of a light-converging function of the lens section.

The conventional, lensed fiber-based LD module, however, allows light that is not converged by the lens section to be coupled into a cladding section as unwanted light or excess light. For example, in the case of a high power LD with an output power of about 10 W, about 0.5 W to 1 W of light may be coupled into the cladding section. Therefore, if the light coupled into the cladding section was absorbed by a coating section or a metal coating section formed in periphery of the optical fiber, the coating section or the metal coating section could be heated to high temperature and thereby damaged.

These problems can be prevented by configuring such that light traveling in the cladding section is coupled into a radiation mode before the light enters the region where the coating section or the metal coating section is formed, so that the light is radiated out of the optical fiber. Some of techniques that are available for causing the light traveling in the cladding section to be coupled into such a radiation mode are an optical fiber disclosed in Patent Literature 1 and an optical transmission fiber disclosed in Patent Literature 2.

The optical fiber disclosed in Patent Literature 1 includes an inner cladding which is made of a material with a low refractive index and an outer cladding which includes (i) small regions filled with air and (ii) scatterers. The small regions filled with air in the outer cladding are partially collapsed along a light-guiding direction. By means of the scatterers contained in the outer cladding, the optical fiber disclosed in Patent Literature 1 scatters light which has leaked into the outer cladding.

In contrast, the optical transmission fiber disclosed in Patent Literature 2 includes an outer cladding layer which is thinner in thickness and lower in refractive index than an inner cladding layer. With the refractive indices set to a suitable value, the optical transmission fiber refracts stray light propagating in the inner cladding layer and captures the stray light in the outer cladding layer. Then, with the thickness of the outer cladding layer being suitably selected, the optical transmission fiber diffuses the captured stray light into a coating.

Well-known technology capable of selectively coupling specific modes to each other is optical fiber gratings (hereinafter, simply "FGs").

The FG is an optical fiber-type optical element in which perturbation in refractive index (hereinafter, "refractive index grating") is formed in a light-guiding direction of an optical fiber.

The refractive index grating of the FG enables the selective coupling of specific modes.

Such FGs are manufactured by irradiating an optical fiber with ultraviolet light so as to change a refractive index of a core section by photorefractive effect. Photorefractive effect is a phenomenon in which, for example, a refractive index of silica glass ($SiO_2$) to which germanium (Ge) is added as a dopant increases when ultraviolet light of a wavelength of about 240 nm is shone on the silica glass. The FG has an advantage that it requires no major changes in the basic structure of a typical optical fiber.

Most technology that is related to such conventional FGs involves refractive index gratings formed in a core section. Patent Literature 3 discloses a FG in which gratings are formed in a core section and a cladding section. In addition, Patent Literature 4 discloses a FG in which refractive index gratings are formed in parts of a cladding section which are close to a core section.

CITATION LIST

Patent Literature

Patent Literature 1
U.S. Patent Application Publication No. 2009/169162 (published Jul. 2, 2009)
Patent Literature 2
Japanese Patent Application Publication, Tokukai, No. 2008-199025A (published Aug. 28, 2008)
Patent Literature 3
Japanese Patent Application Publication, Tokukai, No. 2001-015841A (published Jan. 19, 2001)
Patent Literature 4
PCT International Application Publication, No. 1997/026571 (published Jul. 24, 1997)

SUMMARY OF INVENTION

Technical Problem

However, the conventional optical fiber disclosed in Patent Literature 1 has a problem that it is difficult to scatter light at a desired position with respect to the light-guiding direction because the optical fiber has a special structure in which the scatterer contained in the outer cladding scatters light. In addition, since the optical fiber has a special structure which differs from the structure of a typical optical fiber as mentioned above, it is difficult to carry out fabrication, such as, fusion of optical fibers and fabrication of a lens.

Next, the conventional optical transmission fiber disclosed in Patent Literature 2 requires that the difference in refractive index between the inner cladding layer and the outer cladding layer and the thicknesses of the inner cladding layer and the outer cladding layer be rigorously specified. Furthermore, similarly to the optical fiber disclosed in Patent Literature 1, it is difficult to carry out fabrication and scatter light at a desired position with respect to the light-guiding direction.

Next, the FG disclosed in Patent Literature 3 includes refractive index gratings in a core section and in a cladding section. The FG disclosed in Patent Literature 4 includes refractive index gratings in parts of a cladding section which are close to a core section. Therefore, the refractive index gratings could act as an external disturbance which affects core-mode light and cause a loss in the core-mode light. Note that as described in Patent Literature 3, the same applies to gratings formed by wobbling an optical fiber.

The present invention, conceived in view of these problems, has an object to provide an optical fiber-type optical element, etc. capable of selectively coupling or reflecting cladding-mode light into another mode at a desired position with respect to a light-guiding direction, while excluding as much external disturbance which affects core-mode light as possible.

Solution to Problem

An optical fiber-type optical element of the present invention, to solve the problems, includes: a core section provided so as to extend in a light-guiding direction in which incident light propagates; a photosensitive layer provided so as to extend in the light-guiding direction and peripherally enclose the core section, the photosensitive layer including a refractive index grating formed therein by irradiation with ultraviolet light having a predetermined wavelength; and a cladding section provided between the core section and the photosensitive layer, the cladding section having a lower refractive index than the core section and a lower photosensitivity than the photosensitive layer, the photosensitivity is a property in which a refractive index changes in response to irradiation with the ultraviolet light.

According to the arrangement, the optical fiber-type optical element of the present invention includes: a core section provided so as to extend in a light-guiding direction in which incident light propagates; a photosensitive layer provided so as to extend in the light-guiding direction and peripherally enclose the core section; and a cladding section provided between the core section and the photosensitive layer. Note that the cladding section has a lower refractive index than the core section.

In addition, the photosensitive layer is a layer in which a refractive index grating is formed by irradiation with ultraviolet light having a predetermined wavelength. The cladding section has a lower photosensitivity than the photosensitive layer. The photosensitivity is a property in which a refractive index changes in response to irradiation with ultraviolet light having a predetermined wavelength. In other words, the photosensitive layer has a higher photosensitivity than the cladding section. Note that the photosensitivity refers to a property that a refractive index changes as a result of irradiation with ultraviolet light having a predetermined wavelength and termed the "photorefractive effect."

Hence, the cladding section will be relatively likely affected by the photorefractive effect, whereas the photosensitive layer will relatively likely be affected by the photorefractive effect. Therefore, it is possible to separate, from the core section, the refractive index grating formed by irradiation with ultraviolet light having a predetermined wavelength. Thus, the refractive index grating never acts as an external disturbance to the light (hereinafter, the "core-mode light") propagating as light-guiding mode in which a larger amplitude part is kept within the core section, that is, as light-guiding mode in which total reflection conditions are satisfied by a difference in refractive index between the core and the cladding.

Note that although the perturbation in refractive index in the refractive index grating is preferably periodic, no strict periodicity is required. For example, the period of perturbation of the refractive index grating may be constant in the light-guiding direction or continuously vary in the light-guiding direction (chirped fiber grating). In addition, the refractive index grating may be a long-period grating (described later in detail) and may be a Bragg grating (described later in detail). Note that the Bragg grating may be a slanted Bragg grating (described later in detail).

It is possible to selectively couple or reflect cladding-mode light having a predetermined wavelength into another mode (including radiation mode) at a desired position with respect to the light-guiding direction by adjusting where the refractive index grating is formed and the period of perturbation in the refractive index of the refractive index grating. In addition, use of such a FG eliminates need to bend the shape of the optical fiber-type optical element; effects of the bending cause no loss in the core-mode light. In addition, use of a FG eliminates need for major changes to be made to the basic structure of a typical optical fiber and facilitates fabrication.

As described in the foregoing, according to the optical fiber-type optical element of the present invention, the refractive index grating formed in the optical fiber-type optical element does not act as an external disturbance which affects the core-mode light.

Thus, it is possible to selectively couple or reflect cladding-mode light into another mode at a desired position with respect to the light-guiding direction, while excluding as much external disturbance which affects the core-mode light as possible.

Advantageous Effects of Invention

An optical fiber-type optical element of the present invention, as described in the foregoing, includes: a core section provided so as to extend in a light-guiding direction in which incident light propagates; a photosensitive layer provided so as to extend in the light-guiding direction and peripherally enclose the core section, the photosensitive layer including a refractive index grating formed therein by irradiation with ultraviolet light having a predetermined wavelength; and a cladding section provided between the core section and the photosensitive layer, the cladding section having a lower refractive index than the core section and a lower photosensitivity than the photosensitive layer, the photosensitivity being a property in which a refractive index changes in response to irradiation with the ultraviolet light.

Therefore, the optical fiber-type optical element of the present invention has an advantage of selectively coupling or reflecting cladding-mode light into another mode at a desired position with respect to a light-guiding direction, while excluding as much external disturbance to core-mode light as possible.

Other objectives, features, and advantages of the invention will be more readily understood upon consideration of the following detailed description of the invention, taken in conjunction with the accompanying drawings.

DESCRIPTION OF EMBODIMENTS

Figure 1:
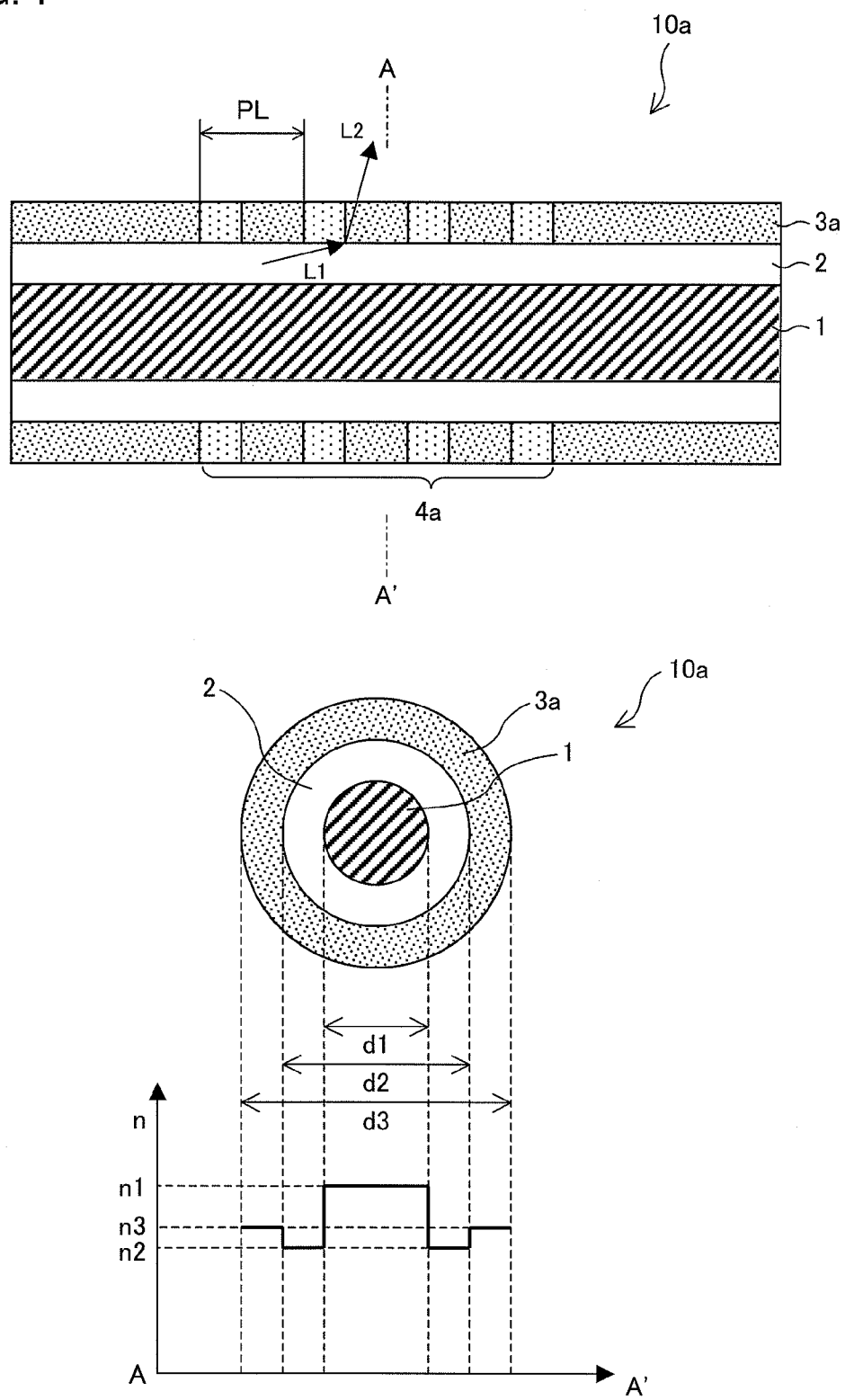
FIG. 1, representing an arrangement of an optical fiber-type optical element which is an embodiment of the present invention, is a cross-sectional view taken on a plane containing a central axis of a core section (top), a cross-sectional view of the optical fiber-type optical element taken along line A-A' (middle), and a graph representing a refractive index distribution in the A-A' cross-section (bottom).

The following will describe an embodiment of the present invention in reference to FIGS. 1 to 7. The arrangement other than what is described in a particular embodiment below may be omitted from description where necessary. Such omitted arrangement is identical to an arrangement described in another embodiment. In addition, for convenience in description, members which have the same function as those described in another embodiment are indicated by the same reference numerals and description thereof is omitted where suitable.

[1. First Embodiment]

First, an optical fiber-type optical element 10a, which is an embodiment of the present invention, will be described in reference to FIG. 1.

FIG. 1, representing an arrangement of the optical fiber-type optical element 10a, is a cross-sectional view taken on a plane containing a central axis of a core section 1 (top), a cross-sectional view of the optical fiber-type optical element 10a taken along line A-A' (middle), and a graph representing a refractive index distribution in the A-A' cross-section (bottom).

As illustrated in FIG. 1, the optical fiber-type optical element 10a has a circular A-A' cross-section and includes a core section 1, a first cladding section (cladding section) 2, and a photosensitive layer 3a. The core section 1 extends in a light-guiding direction in which incident light propagates. The first cladding section (cladding section) 2 is of a substantially circular ring-like shape in its A-A' cross-section and extends in the light-guiding direction so as to peripherally enclose the core section 1. The photosensitive layer 3a is of a substantially circular ring-like shape in its A-A' cross-section and extends in the light-guiding direction so as to enclose the first cladding section 2.

Note that the description "photosensitive" in relation to the photosensitive layer 3a refers to its photosensitivity to ultraviolet light having a predetermined wavelength and also that the terms "photosensitivity" and "photorefractive effect" in relation to the photosensitive layer 3a refer to its property that its refractive index changes as a result of irradiation with ultraviolet light having a predetermined wavelength.

The core section 1 is made primarily of silica glass (silicon dioxide, $SiO_2$) and additionally contains about 4.0 wt % aluminum (Al) so as to have a higher refractive index than the first cladding section 2 and a lower photosensitivity than the photosensitive layer 3b (or a zero photosensitivity). The core section 1 has a diameter (core diameter) d1 of about 105 μm. Note that apart from aluminum, the dopant may be phosphorus (P), but is by no means limited to this.

The first cladding section 2 is made of additive-free silica glass so as to have a lower refractive index than the core section 1 and a lower photosensitivity than the photosensitive layer 3b (or a zero photosensitivity). The first cladding section 2 has a thickness of 7.5 μm and a diameter (first cladding diameter) d2 of 120 μm. Note that although the first cladding section 2 contains no additives (dopants) in the present embodiment, aluminum in a lower concentration than the concentration in the core section 1, phosphorus, fluorine (F) or the like may be used as a dopant for the first cladding section 2.

The photosensitive layer 3a is doped with about 2.4 wt % germanium (Ge) in the present embodiment so as to have a higher photosensitivity than both the core section 1 and the first cladding section 2 (or a non-zero photosensitivity). As a result, the photosensitive layer 3a has a higher refractive index than the first cladding section 2. However, the photosensitive layer 3a may, if necessary, have a lower refractive index than the first cladding section 2.

In addition, the photosensitive layer 3a has a thickness of about 2.5 μm and an outer diameter (photosensitive layer outer diameter) d3 of about 125 μm. Note that the dopant may be titanium oxide ($TiO_2$), boron (B), etc. apart from germanium, but is by no means limited to these.

Note that the graph representing a refractive index distribution in the A-A' cross-section schematically represents relative magnitudes of the refractive indices of the core section 1, the first cladding section 2, and the photosensitive layer 3a. Refractive indices n1, n2, and n3 indicate the refractive indices of the core section 1, the first cladding section 2, and the photosensitive layer 3a respectively. Note that each refractive index is dictated by the type and dose of a dopant added to the silica glass. As such, description of specific values of refractive indices n1 to n3 is omitted.

According to the arrangement above, the first cladding section 2, which exhibits no photorefractive effect, is located between the core section 1 and the photosensitive layer 3a. It therefore becomes possible to create perturbation in the refractive index n only in the photosensitive layer 3a, which is separated from the core section 1, by irradiation with ultraviolet light having a predetermined wavelength.

In the optical fiber-type optical element 10a of the present embodiment, it is only in the photosensitive layer 3a that a grating (refractive index grating) 4a formed by perturbation in the refractive index n caused by irradiation with ultraviolet light having a wavelength of 244 nm (the second harmonic of argon gas laser) is provided. The grating 4a in the photosensitive layer 3a extends about 2 cm in the light-guiding direction from a position about 2.5 cm away from a lens section (one of end faces) 82 (detailed later).

Note that the grating 4a of the present embodiment is a long-period fiber grating (hereinafter, a "long-period grating") exhibiting periodicity in the light-guiding direction and has a period PL of about a few micrometers to 100 μm. The grating 4a, however, may not have strict periodicity. For example, the period PL may be constant in the light-guiding direction and may continuously vary in the light-guiding direction (chirped FG).

In addition, where necessary, the grating 4a may be a short-period (less than or equal to 1 μm) fiber Bragg grating (hereinafter, a "Bragg grating"). Furthermore, the grating 4a may be a slanted Bragg grating (hereinafter, a "slanted grating") as in an example described in the sixth embodiment which will be described later in detail. A slanted grating is capable of strongly coupling to radiation mode due to its angle converting effect.

From the description above, it is possible to selectively couple cladding-mode light L1 having a predetermined wavelength in the first cladding section 2 into another mode (e.g., radiation mode L2) where necessary, by adjusting the period PL of the grating 4a as illustrated in FIG. 1. Besides, since the grating 4a is provided so as to be separated from the core section 1, effects of the grating 4a cause no loss in light-guiding mode (hereinafter, "core-mode light") in which total reflection conditions are satisfied by a difference in refractive index between the core section 1 and the first cladding section 2.

Note that according to the optical transmission fiber of Patent Literature 2 above, the coating needs to be peeled off at precise positions when stray light should leak from any particular part of the optical transmission fiber. This fabrication is very difficult and problematic in terms of precision in fabrication. Furthermore, since the core-mode light leaks into the coating section, which heats up the coating section, a structure is needed to discharge the heat. This in turn restricts structural freedom. In contrast, according to the optical fiber-type optical element 10a of the present embodiment, it is possible to form the grating 4a at any given part of the photosensitive layer 3a with respect to the light-guiding direction, by simply irradiating the part with ultraviolet light, so as to couple stray light into radiation mode. The optical fiber-type optical element 10a thus allows for easy control of distance of the fiber and provides high structural freedom.

(Distance from Core Section/Cladding Section Interface to Photosensitive Layer)

Next will be described a distance, Δ(=(d2−d1)/2, not shown), from an interface between the core section 1 and the first cladding section 2 to the photosensitive layer 3a. Note that the distance is equivalent to the thickness of the cladding section.

A leakage depth in leakage from the interface to the first cladding section 2 is generally approximately equal to a wavelength of the light-guiding mode. In other words, Distance Δ≈Wavelength of Light-guiding Mode.

In other words, when Distance Δ≥Wavelength of Light-guiding Mode, the light-guiding mode (core-mode light) in which a larger light amplitude part is mainly within the core section 1 is practically not affected by the grating 4a.

Next, from a light intensity viewpoint, if the photosensitive layer 3b is formed in a region where the core-mode light has an intensity which is lower than $1/e^2$ times a maximum intensity (the region corresponds to a region outside a mode field diameter of a single-mode fiber), the core-mode light can be regarded as practically not being affected by the grating 4a.

The following will describe, from an electric power viewpoint, conditions to restrain electric power corresponding to part of light which is affected by a refractive index grating to less than or equal to 1% of electric power of light which leaks from the core section 1 to the first cladding section 2.

First, the effect of the grating 4a on the core-mode light can be estimated from equation (1) below. Equation (1) gives an electric field distribution $E_z(r)$ for a step index fiber outside a core (r>a) when the core diameter is "a," and the light-guiding mode in direction θ has an order of 1. $J_1(\kappa a)$ is a Bessel function, and $K_1(\gamma r)$ is a modified Bessel function.

[Math. 1]

$$E_z(r) < \frac{J_1(\kappa a)}{K_1(\gamma a)} \times K_1(\gamma r) \times \cos(1\theta + \phi_1) \qquad (1)$$

In this situation, attenuation into the cladding section is given by $K_1(\gamma r)$, and an attenuation coefficient decreases with a decrease in a mode number in direction θ. Therefore, only the basic mode (1=0) will be considered below. In this situation, attenuation into the cladding section for the basic mode is given by $K_0(\gamma r)$.

In addition, κ is a wave number, γ is a constant defined by equation (2) below, and $\phi_1$ is an initial phase.

[Math. 2]

$$\gamma = k_0 \sqrt{n_{eq}^2 - n_2^2} \qquad (2)$$

Note that $k_0$ is a constant, $n_{eq}$ is an equivalent refractive index of the core section for the wavelength of the basic mode, and $n_2$ is the refractive index of the cladding section.

It is understood from equation (2) that the light-guiding mode of the highest order for a multi-mode core has a lower attenuation coefficient.

For example, assuming that light having a wavelength of about 900 nm is traveling along a silica glass-based core section, that the equivalent refractive index, $n_{eq}$, of the core section differs from the refractive index, $n_2$, of the cladding section by $10^{-4}$, and that the distance Δ is greater than or equal to 5 μm, part of light which corresponds to less than or equal to 1% of electric power of light which leaks from the core to the cladding is affected by the refractive index grating.

Thus, strictly speaking, the part of light which corresponds to less than or equal to 1% of electric power of light which leaks from the core section 1 to the first cladding section 2 is affected by the refractive index grating at distance Δ=5 μm.

However, if the core diameter is sufficiently large, the core-mode light can be regarded as being mainly within the core section. At distance Δ=5 μm, the effect of the refractive index grating on the core-mode light can be regarded as being negligible.

In other words, if distance Δ≥5 μm, part corresponding to greater than or equal to 99% of electric power of light traveling along the core section 1 is not affected by the grating 4a.

From the description above, more specifically, it is preferable that distance Δ≥5 μm.

In addition, from a viewpoint of loss of the core-mode light, in the cases of the optical fiber-type optical element 10a and the optical fiber-type optical elements 10b to 10d (which will be described later in detail), loss of light in light-guiding mode in which a larger light amplitude part is mainly within the core section 1 is preferably more than 0 dB/mm and less than or equal to 0.3 dB/mm.

When the loss of the core-mode light is less than or equal to 0.3 dB/mm, the gratings 4a to 4d formed in the optical fiber-type optical elements 10a to 10d can be regarded as being separated by a sufficient distance from the core section 1 and not acting as an external disturbance which affects the core-mode light.

As described in the foregoing, according to the optical fiber-type optical element 10a, the optical fiber-type optical element 10a does not need to be bent, and the grating 4a of the photosensitive layer 3a does not act as an external disturbance (thus, the core-mode light is not affected). Therefore, the external disturbance which can affect the core-mode light can be excluded as much as possible.

Thus, it is possible to exclude the external disturbance which can affect the core-mode light as much as possible and to selectively couple or reflect the cladding-mode light in the first cladding section 2 into another mode (radiation mode) at any position with respect to the light-guiding direction. In addition, since the FG technique is used, no major changes need to be made to the basic structure of the optical fiber-type optical element 10a, and the fabrication of the optical fiber-type optical element 10a is facilitated.

[2. Second Embodiment]

Next, an optical fiber-type optical element 10b, which is another embodiment of the present invention, will be described in reference to FIG. 2.

Figure 2:
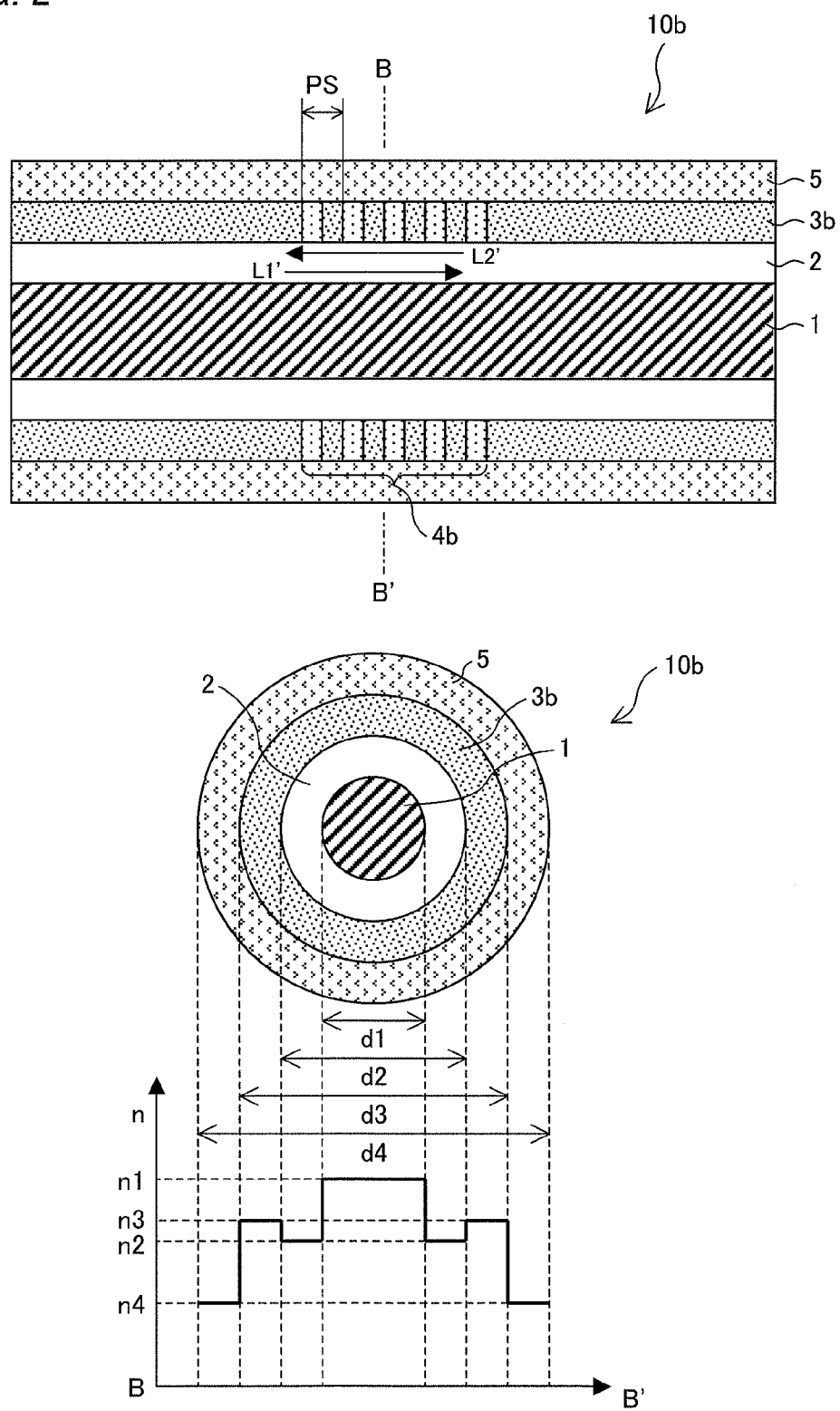
FIG. 2, representing a structure of an optical fiber-type optical element which is another embodiment of the present invention, is a cross-sectional view taken on a plane containing an axis of a core section (top), a cross-sectional view of the optical fiber-type optical element taken along line B-B' (middle), and a graph representing a refractive index distribution in the B-B' cross-section (bottom).

FIG. 2, representing an arrangement of the optical fiber-type optical element 10b, is a cross-sectional view taken on a plane containing a central axis of a core section 1 (top), a cross-sectional view of the optical fiber-type optical element 10b taken along line B-B' (middle), and a graph representing a refractive index distribution in the B-B' cross-section (bottom).

The optical fiber-type optical element 10b is a so-called double cladding fiber. As illustrated in FIG. 2, the optical fiber-type optical element 10b has a circular B-B' cross-section and includes a core section 1, a first cladding section 2, a photosensitive layer 3b, and a second cladding section (cladding section) 5. The core section 1 extends in a light-guiding direction in which incident light propagates. The first cladding section 2 is of a substantially circular ring-like shape in its B-B' cross-section and extends in the light-guiding direction so as to peripherally enclose the core section 1. The photosensitive layer 3b is of a substantially circular ring-like shape in its B-B' cross-section and extends in the light-guiding direction so as to peripherally enclose the first cladding section. The second cladding section (cladding section) 5 is of a substantially circular ring-like shape in its B-B' cross-section and extends in the light-guiding direction so as to peripherally enclose the photosensitive layer 3b. Note that the description "photosensitive" in relation to the photosensitive layer 3b has the same meaning as in relation to the photosensitive layer 3a mentioned above. In addition, the terms "photosensitivity" and "photorefractive effect" in relation to the photosensitive layer 3b has the same meaning as in relation to the photosensitive layer 3a mentioned above.

Note that in the following description, when there are more than one cladding section, the cladding sections will be referred to, for example, starting with the one closest to the core section 1, as a first cladding section 2, a second cladding section 5, ..., an L-th cladding section, ..., and an N-th cladding section (L and N are natural numbers and L<N).

In this situation, the photosensitive layer 3b may be disposed close to an outer circumference of a select one of the first cladding section 2 through the N-th cladding section.

For example, when cladding-mode light in the L-th cladding section is to be selectively coupled or reflected into another mode (including radiation mode), the photosensitive layer 3b may be disposed close to an outer circumference of the L-th cladding section.

The core section 1 is made primarily of silica glass and additionally contains 6.0 wt % aluminum so as to have a higher refractive index than the first cladding section 2 and a lower photosensitivity than the photosensitive layer 3b (or a zero photosensitivity). The core section 1 has a diameter (core diameter) d1 of 20 µm. Note that apart from aluminum, the dopant may be phosphorus, but is by no means limited to these. Note that the core section 1 additionally contains about 1,000 ppm to 1,00,000 ppm ytterbium (Yb), which is a rare earth metal, so that the core section 1 can be utilized as an amplifier medium in a fiber laser. Note that the rare earth metal may alternatively be thulium (Tm) or erbium (Er), but is by no means limited to this.

The first cladding section 2 is made primarily of silica glass and additionally contains 2.5 wt % aluminum so as to have a lower refractive index than the core section 1 and a lower photosensitivity than the photosensitive layer 3b (or a zero photosensitivity). The first cladding section 2 has a thickness of 20 µm and a diameter (first cladding diameter) d2 of about 60 µm. Note that the dopant may be phosphorus, fluorine, etc. apart from aluminum in a lower concentration than the concentration in the core section 1, but is by no means limited to these.

The photosensitive layer 3b additionally contains about 3.0 wt % germanium so as to have a lower refractive index than the first cladding section 2 and a higher photosensitivity than both the core section 1 and the first cladding section 2 (or a non-zero photosensitivity). In addition, the photosensitive layer 3b has a thickness of about 140 µm and an outer diameter (photosensitive layer outer diameter) d3 of about 340 µm. Note that apart from germanium, the dopant may be titanium oxide or boron, but is by no means limited to these.

The second cladding section 5 is made of additive-free silica glass so as to have a lower refractive index than the photosensitive layer 3b and a lower photosensitivity than the photosensitive layer 3b. The second cladding section 5 has a thickness of about 30 µm and a diameter (second cladding diameter) d4 of about 400 µm.

Note that the graph representing a refractive index distribution in the B-B' cross-section schematically represents relative magnitudes of the refractive indices of the core section 1, the first cladding section 2, the photosensitive layer 3b, and the second cladding section 5. Refractive indices n1, n2, n3, and n4 indicate the refractive indices of the core section 1, the first cladding section 2, the photosensitive layer 3b, and the second cladding section 5 respectively. Note that each refractive index is dictated by the type and does of a dopant added to the silica glass. As such, description of specific values of refractive indices n1 to n4 is omitted.

According to the arrangement above, the first cladding section 2, which exhibits no photorefractive effect, is located between the core section 1 and the photosensitive layer 3b. It therefore becomes possible to create perturbation in the refractive index n only in the photosensitive layer 3b, which is separated from the core section 1, by irradiation with ultraviolet light having a predetermined wavelength.

In the optical fiber-type optical element 10b of the present embodiment, it is only in the photosensitive layer 3b that a grating (refractive index grating) 4b formed by perturbation in the refractive index n caused by irradiation with ultraviolet light having a wavelength of 244 nm is provided. The grating 4b in the photosensitive layer 3b extends about 20 mm in the light-guiding direction from a position of one of end faces of the optical fiber-type optical element 10b.

Note that the grating 4b of the present embodiment is a Bragg grating exhibiting periodicity in the light-guiding direction and has a period PS of about 310 nm. In addition, the grating 4a may, where necessary, be a Bragg grating having an integral multiple of wavelength, the aforementioned long-period grating, or a slanted Bragg grating.

From the description above, it is possible to selectively reflect cladding-mode light L1' having a predetermined wavelength in the first cladding section 2 and the photosensitive layer 3b at any position with respect to the light-guiding direction, where necessary, by adjusting the period PS of the grating 4b as illustrated in FIG. 2, so as to produce reflected light L2'. Besides, since the grating 4b is provided so as to be separated from the core section 1, effects of the grating 4b cause no loss in core-mode light.

Note that a distance, Δ (thickness of the first cladding section 2), from an interface between the core section 1 and the first cladding section 2 to the photosensitive layer 3b is the same as in the first embodiment. In other words, if the photosensitive layer 3b is formed in a region where the core-mode light has an intensity which is lower than $1/e^2$ times a maximum intensity, the core-mode light is practically not affected by the grating 4a. In addition, more preferably, distance Δ≥5 μm.

As described in the foregoing, according to the optical fiber-type optical element 10b, the optical fiber-type optical element 10b does not need to be bent, and the grating 4b of the photosensitive layer 3b does not act as an external disturbance (thus, the core-mode light is not affected). Therefore, the external disturbance which can affect the core-mode light can be excluded as much as possible.

Thus, it is possible to exclude the external disturbance which can affect the core section 1 as much as possible and to selectively reflect the cladding-mode light in the first cladding section 2 at a desired position with respect to the light-guiding direction. In addition, since the FG technique is used, no major changes need to be made to the basic structure of the optical fiber-type optical element 10b, and the fabrication of the optical fiber-type optical element 10b is facilitated.

[3. Third Embodiment]

Next, an optical fiber-type optical element 10c, which is an embodiment of the present invention, will be described in reference to FIG. 3.

Figure 3:
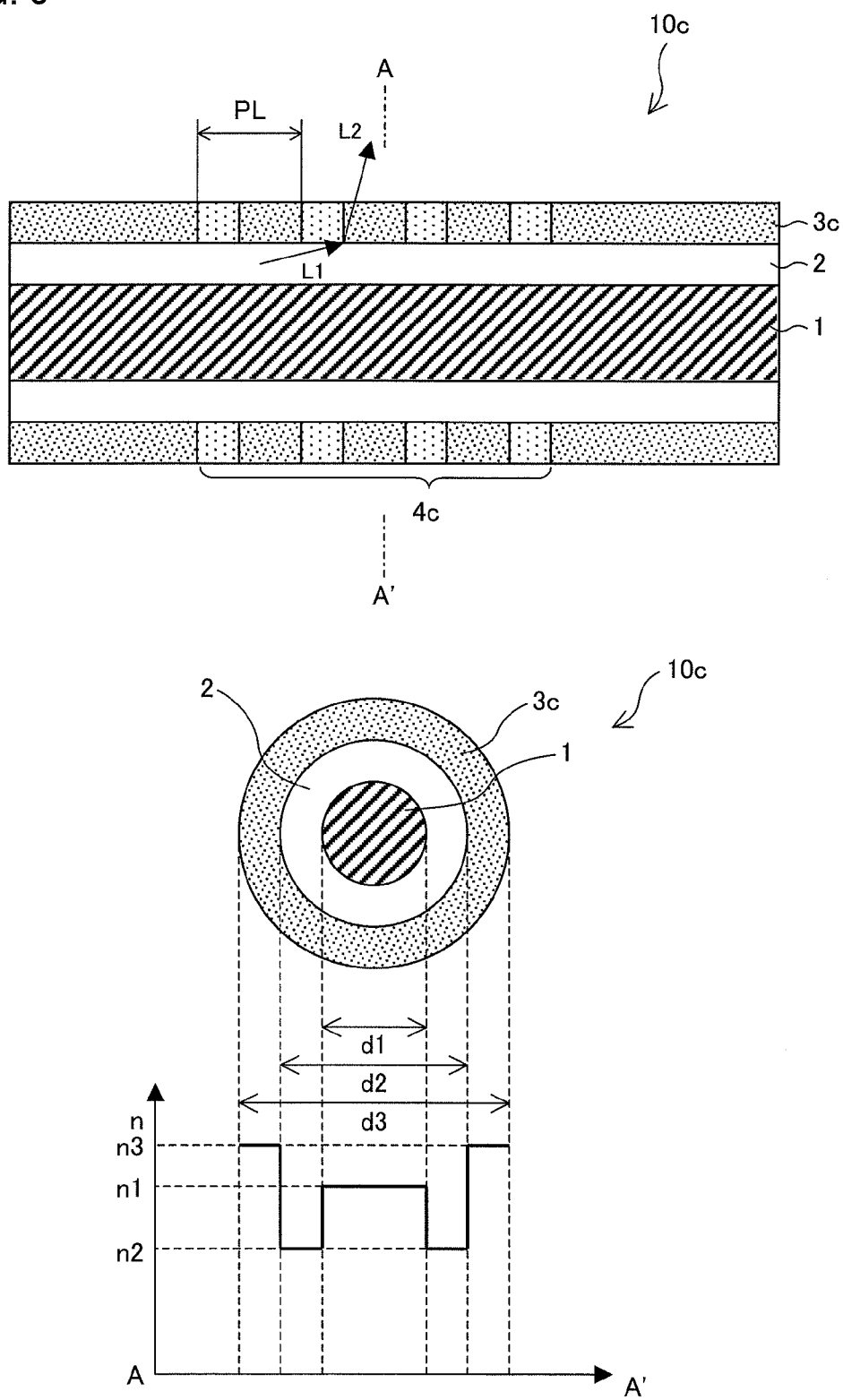
FIG. 3, representing an arrangement of an optical fiber-type optical element which is another embodiment of the present invention, is a cross-sectional view taken on a plane containing a central axis of a core section (top), a cross-sectional view of the optical fiber-type optical element taken along line A-A' (middle), and a graph representing a refractive index distribution in the A-A' cross-section (bottom).

FIG. 3, representing an arrangement of the optical fiber-type optical element 10c, is a cross-sectional view taken on a plane containing a central axis of a core section 1 (top), a cross-sectional view of the optical fiber-type optical element 10c taken along line A-A' (middle), and a graph representing a refractive index distribution in the A-A' cross-section (bottom).

As illustrated in FIG. 3, the optical fiber-type optical element 10c has a circular A-A' cross-section and includes a core section 1, a first cladding section (cladding section) 2, and a photosensitive layer 3c. The core section 1 extends in a light-guiding direction in which incident light propagates. The first cladding section (cladding section) 2 is of a substantially circular ring-like shape in its A-A' cross-section and extends in the light-guiding direction so as to peripherally enclose the core section 1. The photosensitive layer 3c is of a substantially circular ring-like shape in its A-A' cross-section and extends in the light-guiding direction so as to enclose the first cladding section 2.

Note that the description "photosensitive" and the terms "photosensitivity" and "photorefractive effect" in relation to the photosensitive layer 3c have the same meaning as in relation to the photosensitive layer 3a and the photosensitive layer 3b mentioned above.

The core section 1 is made of additive-free silica glass so as to have a lower photosensitivity than the photosensitive layer 3c (or a zero photosensitivity). The core section 1 has a higher refractive index than the first cladding section 2 and a diameter (core diameter) d1 of about 105 μm.

The first cladding section 2 is made primarily of silica glass and additionally contains about 2.0 wt % fluorine (F) so as to have a lower refractive index than the core section 1 and a lower photosensitivity than the photosensitive layer 3c (or a zero photosensitivity).

The first cladding section 2 has a thickness of 7.5 μm and a diameter (first cladding diameter) d2 of 120 μm. Note that apart from fluorine mentioned above, the dopant may be aluminum, phosphorus, or the like, but is by no means limited to these.

The photosensitive layer 3c is doped with about 2.4 wt % germanium (Ge) in the present embodiment, so as to have a higher photosensitivity than both the core section 1 and the first cladding section 2 (or a non-zero photosensitivity). As a result, the photosensitive layer 3c has a higher refractive index than the first cladding section 2. However, the photosensitive layer 3c may, if necessary, have a lower refractive index than the first cladding section 2.

In addition, the photosensitive layer 3c has a thickness of about 2.5 μm and an outer diameter (photosensitive layer outer diameter) d3 of about 125 μm. Note that the dopant may be titanium oxide ($TiO_2$), boron (B), etc. apart from germanium, but is by no means limited to these.

Note that the graph representing a refractive index distribution in the A-A' cross-section schematically represents relative magnitudes of the refractive indices of the core section 1, the first cladding section 2, and the photosensitive layer 3c. Refractive indices n1, n2, and n3 indicate the refractive indices of the core section 1, the first cladding section 2, and the photosensitive layer 3c respectively. Note that each refractive index is dictated by the type and dose of a dopant added to the silica glass. As such, description of specific values of refractive indices n1 to n3 is omitted.

According to the arrangement above, the first cladding section 2, which exhibits no photorefractive effect, is located between the core section 1 and the photosensitive layer 3a. It therefore becomes possible to create perturbation in the refractive index n only in the photosensitive layer 3c, which is separated from the core section 1, by irradiating with ultraviolet light having a predetermined wavelength.

In the optical fiber-type optical element 10a of the present embodiment, it is only in the photosensitive layer 3c that a grating (refractive index grating) 4c formed by perturbation in the refractive index n caused by irradiation with ultraviolet light having a wavelength of 244 nm (the second harmonic of argon gas laser) is provided. The grating 4c in the photosensitive layer 3c extends about 2 cm in the light-guiding direction from a position about 2.5 cm away from a lens section (one of end faces) 82 (detailed later).

Note that the grating 4c of the present embodiment is a long-period grating mentioned above and has a period PL of about a few micrometers to 100 μm. The grating 4c, however, may not have strict periodicity. For example, the period PL may be constant in the light-guiding direction and may continuously vary in the light-guiding direction (chirped FG).

In addition, where necessary, the grating 4c may be a Bragg grating mentioned above. Furthermore, the grating 4c may be a slanted grating mentioned above as in an example described in the sixth embodiment which will be described later in detail.

From the description above, it is possible to selectively couple cladding-mode light L1 having a predetermined wavelength in the first cladding section 2 with another mode (e.g., radiation mode L2) where necessary, by adjusting the period PL of the grating 4c as illustrated in FIG. 3. Besides, since the grating 4c is provided so as to be separated from the core section 1, effects of the grating 4c cause no loss in core-mode light.

Note that according to the optical transmission fiber of Patent Literature 2 above, the coating needs to be peeled off at precise positions when stray light should leak from any particular part of the optical transmission fiber. This fabrication is very difficult and problematic in terms of precision in fabrication. Furthermore, since the core-mode light leaks into the coating section, which heats up the coating section, a structure is needed to discharge the heat. This in turn restricts structural freedom. In contrast, according to the optical fiber-type optical element 10c of the present embodiment, it is possible to form the grating 4c at any given part of the photosensitive layer 3c with respect to the light-guiding direction, by simply irradiating the part with ultraviolet light, so as to couple stray light into radiation mode. The optical fiber-type optical element 10c thus allows for easy control of distance of the fiber and provides high structural freedom.

Note that a distance, Δ (thickness of the first cladding section 2), from an interface between the core section 1 and the first cladding section 2 to the photosensitive layer 3c is the same as in the first embodiment. In other words, if the photosensitive layer 3c is formed in a region where the core-mode light has an intensity which is lower than $1/e^2$ times a maximum intensity, the core-mode light is practically not affected by the grating 4c. In addition, more preferably, distance Δ≥5 μm.

In addition, from a viewpoint of loss of the core-mode light, in the case of the optical fiber-type optical element 10c, loss of light in light-guiding mode in which a larger light amplitude part is mainly within the core section 1 is preferably more than 0 dB/mm and less than or equal to 0.3 dB/mm.

When the loss of the core-mode light is less than or equal to 0.3 dB/mm, the grating 4c formed in the optical fiber-type optical element 10c can be regarded as being separated by a sufficient distance from the core section 1 and not acting as an external disturbance which affects the core-mode light.

As described in the foregoing, according to the optical fiber-type optical element 10c, the optical fiber-type optical element 10c does not need to be bent, and the grating 4c of the photosensitive layer 3c does not act as an external disturbance (thus, the core-mode light is not affected). Therefore, the external disturbance which can affect the core-mode light can be excluded as much as possible.

Thus, it is possible to exclude the external disturbance which can affect the core-mode light as much as possible and to selectively couple or reflect the cladding-mode light in the first cladding section 2 into another mode (radiation mode) at any position with respect to the light-guiding direction. In addition, since the FG technique is used, no major changes need to be made to the basic structure of the optical fiber-type optical element 10c, and the fabrication of the optical fiber-type optical element 10c is facilitated.

[4. Fourth Embodiment]

Next, an optical fiber-type optical element 10d, which is another embodiment of the present invention, will be described in reference to FIG. 4.

Figure 4:
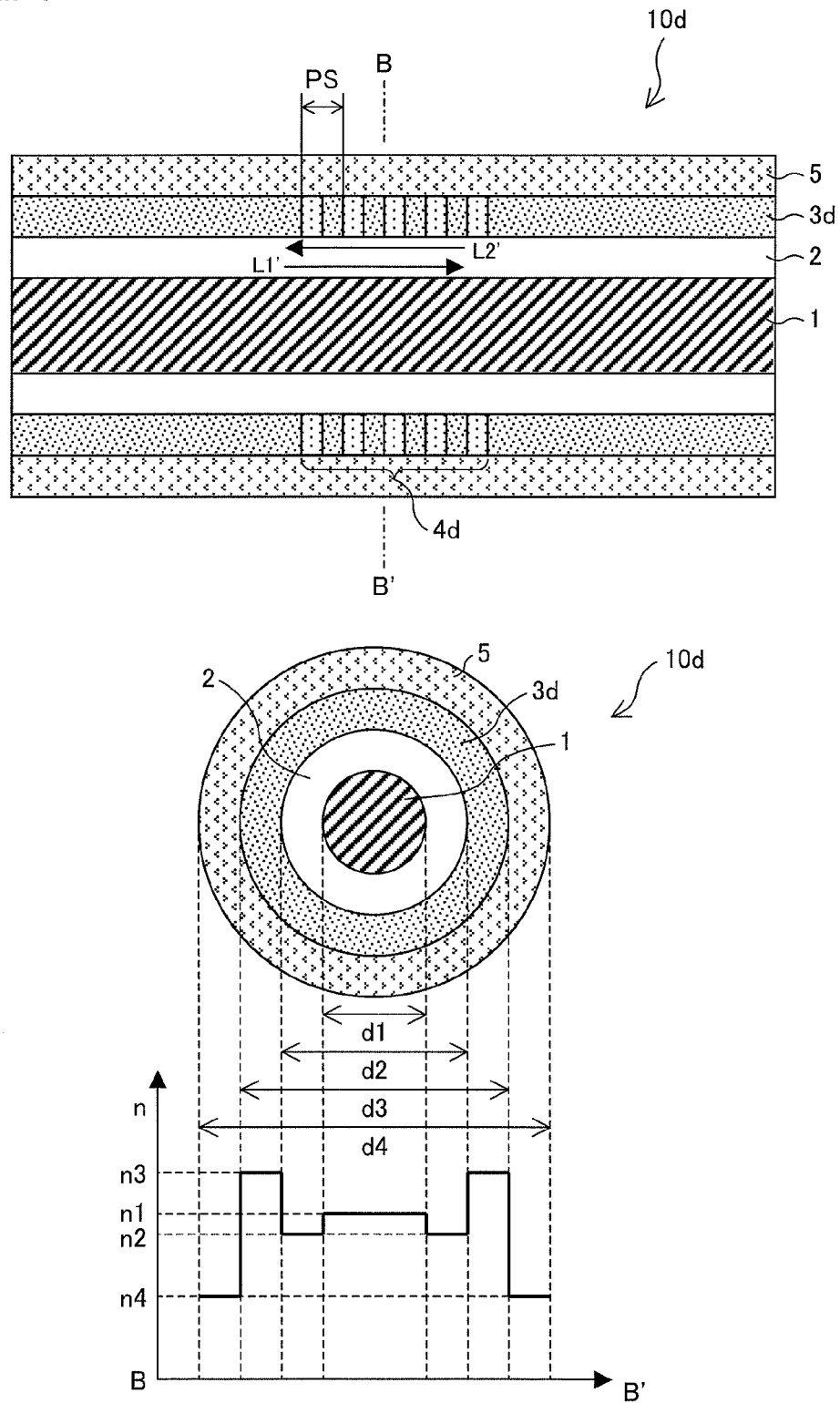
FIG. 4, representing a structure of an optical fiber-type optical element which is another embodiment of the present invention, is a cross-sectional view taken on a plane containing an axis of a core section (top), a cross-sectional view of the optical fiber-type optical element taken along line B-B' (middle), and a graph representing a refractive index distribution in the B-B' cross-section (bottom).

FIG. 4, representing an arrangement of the optical fiber-type optical element 10d, is a cross-sectional view taken on a plane containing a central axis of the core section 1 (top), a cross-sectional view of the optical fiber-type optical element 10d taken along line B-B' (middle), and a graph representing a refractive index distribution in the B-B' cross-section (bottom).

The optical fiber-type optical element 10d is a so-called double cladding fiber. As illustrated in FIG. 4, the optical fiber-type optical element 10d has a circular B-B' cross-section and includes a core section 1, a first cladding section 2, a photosensitive layer 3d, and a second cladding section (cladding section) 5. The core section 1 extends in a light-guiding direction in which incident light propagates. The first cladding section 2 is of a substantially circular ring-like shape in its B-B' cross-section and extends in the light-guiding direction so as to peripherally enclose the core section 1. The photosensitive layer 3d is of a substantially circular ring-like shape in its B-B' cross-section and extends in the light-guiding direction so as to peripherally enclose the first cladding section. The second cladding section (cladding section) 5 is of a substantially circular ring-like shape in its B-B' cross-section and extends in the light-guiding direction so as to peripherally enclose the photosensitive layer 3d. Note that the description "photosensitive" and the terms "photosensitivity" and "photorefractive effect" in relation to the photosensitive layer 3d have the same meaning as in relation to the photosensitive layers 3a to 3c mentioned above.

Note that in the following description, when there are more than one cladding section, the cladding sections will be referred to, for example, starting with the one closest to the core section 1, as a first cladding section 2, a second cladding section 5, . . . , an L-th cladding section, . . . , and an N-th cladding section (L and N are natural numbers and L<N).

In this situation, the photosensitive layer 3d may be disposed close to an outer circumference of a select one of the first cladding section 2 through the N-th cladding section.

For example, when cladding-mode light in the L-th cladding section is to be selectively coupled or reflected into another mode (including radiation mode), the photosensitive layer 3d may be disposed close to the outer circumference of the L-th cladding section.

The core section 1 is made of additive-free silica glass so as to have a lower photosensitivity than the photosensitive layer 3d (or a zero photosensitivity). The core section 1 has a diameter (core diameter) d1 of 20 μm. Note that although the core section 1 contains no additives (dopants) in the present embodiment, aluminum, phosphorus, fluorine (F), or the like may be used as a dopant.

In addition, the core section 1 additionally contains about 1,000 ppm to 1,00,000 ppm ytterbium (Yb), which is a rare earth metal, so that the core section 1 can be utilized as an amplifier medium in a fiber laser. Note that the rare earth metal may alternatively be thulium (Tm) or erbium (Er), but is by no means limited to this.

The first cladding section 2 is made primarily of silica glass and doped with about 2.0 wt % fluorine (F), so as to have a lower refractive index than the core section 1 and a lower photosensitivity than the photosensitive layer 3d (or a zero photosensitivity).

The first cladding section 2 has a thickness of 20 μm and a diameter (first cladding diameter) d2 of about 60 μm. Note that apart from aluminum, the dopant may be phosphorus, but is by no means limited to these.

The photosensitive layer 3d additionally contains about 3.0 wt % germanium so as to have a lower refractive index than the first cladding section 2 and a higher photosensitivity than both the core section 1 and the first cladding section 2 (or a non-zero photosensitivity). In addition, the photosensitive layer 3d has a thickness of about 140 μm and an outer diameter (photosensitive layer outer diameter) d3 of about 340 μm.

Note that apart from germanium, the dopant may be titanium oxide, boron, or the like, but is by no means limited to these.

The second cladding section 5 is made of additive-free silica glass so as to have a lower refractive index than the photosensitive layer 3d and a lower photosensitivity than the photosensitive layer 3d. The second cladding section 5 has a thickness of about 30 μm and a diameter (second cladding diameter) d4 of about 400 μm.

Note that the graph representing a refractive index distribution in the B-B' cross-section schematically represents relative magnitudes of the refractive indices of the core section 1, the first cladding section 2, the photosensitive layer 3d, and the second cladding section 5. Refractive indices n1, n2, n3, and n4 indicate the refractive indices of the core section 1, the first cladding section 2, the photosensitive layer 3d, and the second cladding section 5 respectively. Note that each refractive index is dictated by the type and dose of a dopant added to the silica glass. As such, description of specific values of refractive indices n1 to n4 is omitted.

According to the arrangement above, the first cladding section 2, which exhibits no photorefractive effect, is located between the core section 1 and the photosensitive layer 3d. It therefore becomes possible to create perturbation in the refractive index n only in the photosensitive layer 3d, which is separated from the core section 1, by irradiation with ultraviolet light having a predetermined wavelength.

In the optical fiber-type optical element 10d of the present embodiment, it is only in the photosensitive layer 3d that a grating (refractive index grating) 4d formed by perturbation in the refractive index n caused by irradiation with ultraviolet light having a wavelength of 244 nm is provided. The grating 4d in the photosensitive layer 3d extends about 20 mm in the light-guiding direction from a position of one of end faces of the optical fiber-type optical element 10d.

Note that the grating 4d of the present embodiment is a Bragg grating exhibiting periodicity in the light-guiding direction and has a period PS of about 310 nm. In addition, the grating 4d may, where necessary, be a Bragg grating having an integral multiple of wavelength, the aforementioned long-period grating, or a slanted Bragg grating.

From the description above, it is possible to selectively reflect cladding-mode light L1' having a predetermined wavelength in the first cladding section 2 and the photosensitive layer 3d at any position with respect to the light-guiding direction, where necessary, by adjusting the period PS of the grating 4d as illustrated in FIG. 4, so as to produce reflected light L2'. Besides, since the grating 4d is provided so as to be separated from the core section 1, effects of the grating 4d cause no loss in core-mode light.

Note that a distance, Δ (thickness of the first cladding section 2), from an interface between the core section 1 and the first cladding section 2 to the photosensitive layer 3d is the same as in the first embodiment. In other words, if the photosensitive layer 3d is formed in a region where the core-mode light has an intensity which is lower than $1/e^2$ times a maximum intensity, the core-mode light is practically not affected by the grating 4d. In addition, more preferably, distance Δ≧5 μm.

As described in the foregoing, according to the optical fiber-type optical element 10d, the optical fiber-type optical element 10d does not need to be bent, and the grating 4d of the photosensitive layer 3d does not act as an external disturbance (thus, the core-mode light is not affected). Therefore, the external disturbance which can affect the core-mode light can be excluded as much as possible.

Thus, it is possible to exclude the external disturbance which can affect the core section 1 as much as possible and to selectively reflect the cladding-mode light in the first cladding section 2 at a desired position with respect to the light-guiding direction. In addition, since the FG technique is used, no major changes need to be made to the basic structure of the optical fiber-type optical element 10d, and the fabrication of the optical fiber-type optical element 10d is facilitated.

[5. Method of Forming Refractive Index Grating]

Next, a method of forming the aforementioned gratings 4a to 4d will be described in reference to (a) of FIG. 5 to (d) of FIG. 5. Note that the method of forming a refractive index grating described here is commonly applicable to the aforementioned first to fourth embodiments and the fifth and sixth embodiments which will be described later. In addition, the method of forming a refractive index grating is by no means limited to the method described here.

Figure 5:
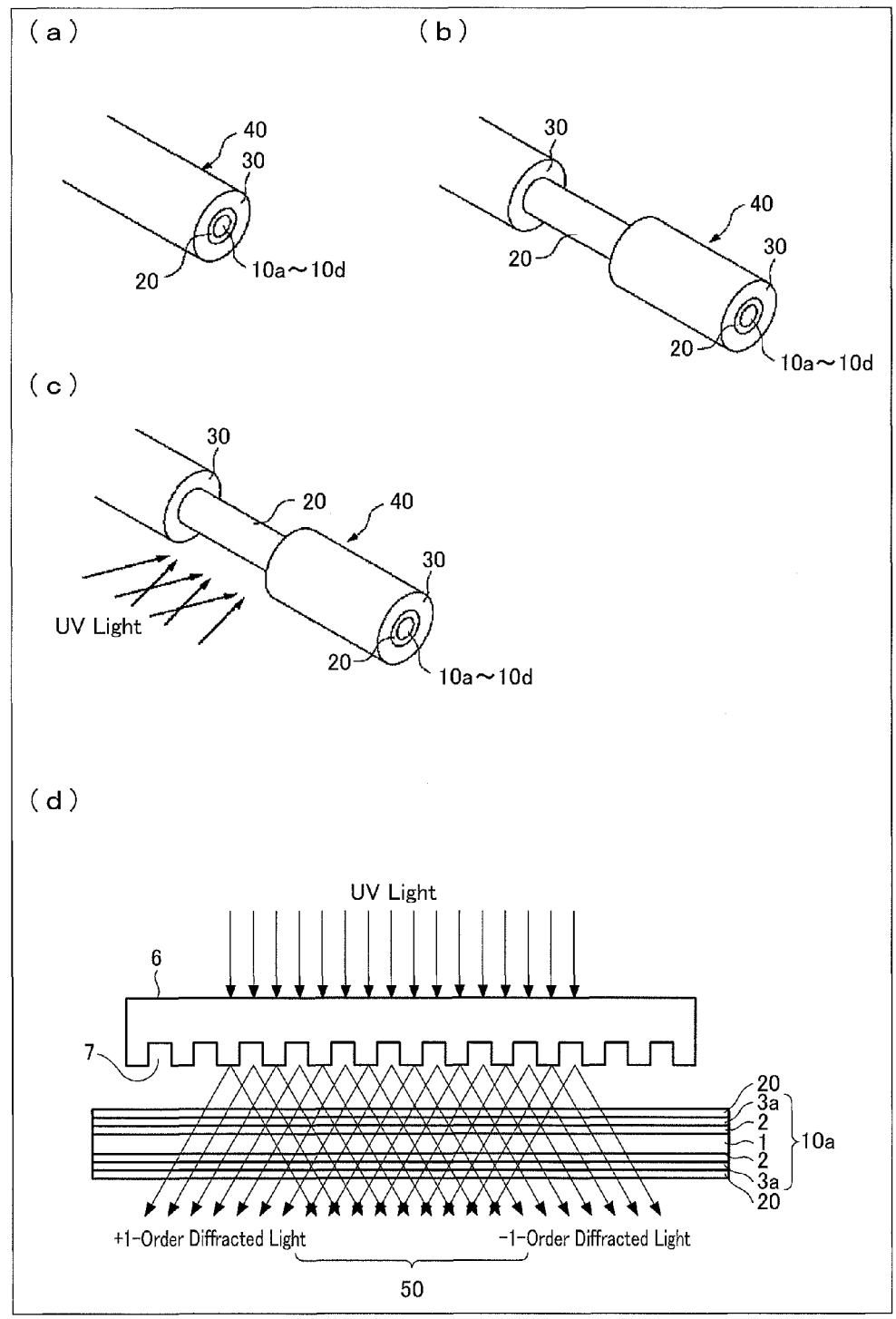
FIG. 5 is a drawing for illustrating a method of manufacturing the optical fiber-type optical element. (a) of FIG. 5 illustrates the optical fiber-type optical element having its periphery covered with a primary coating layer and a secondary coating layer. (b) of FIG. 5 illustrates a part of the secondary coating layer having been removed. (c) of FIG. 5 illustrates ultraviolet light being shone onto the part where the secondary coating layer has been removed. (d) of FIG. 5 illustrates a layout of various elements when the primary coating layer is irradiated with diffracted ultraviolet light.

First, (a) of FIG. 5 is a perspective view of the optical fiber-type optical elements 10a to 10d having their periphery covered with a primary coating layer 20 and a secondary coating layer 30.

In addition, (b) of FIG. 5 is a perspective view of a part of the secondary coating layer 30 having been removed.

Next, (c) of FIG. 5 is a perspective view of ultraviolet light being shone onto the part where the secondary coating layer 30 has been removed.

Furthermore, (d) of FIG. 5 is an arrangement diagram illustrating a layout of various elements when the primary coating layer 20 is irradiated with diffracted ultraviolet light.

As illustrated in (a) of FIG. 5, the optical fiber-type optical elements 10a to 10d has its outer circumference covered with the primary coating layer 20 and the secondary coating layer 30, so as to form a covered fiber 40.

The primary coating layer 20 is made of a thermosetting silicone resin having a high transmittance to ultraviolet light (which, hereinafter, may be referred to as "UV light"). A specific example is dimethyl silicone resin. A thermosetting silicone resin has a transmittance of about 90% to ultraviolet light having a wavelength of 244 nm. Thus, ultraviolet light shone from above the primary coating layer 20 that is made of this silicone resin reaches the optical fiber-type optical elements 10a to 10d. Thus, it is not necessary to remove the primary coating layer 20 when the gratings 4a to 4d are formed in the optical fiber-type optical elements 10a to 10d.

The primary coating layer 20 preferably has a thickness of 1 μm to 10 μm. If the thickness is less than 1 μm, the primary coating layer 20 fails to provide sufficient protection to the optical fiber-type optical elements 10a to 10d; if the thickness is in excess of 10 μm, the primary coating layer 20 absorbs too much of ultraviolet light in the formation of the gratings 4a to 4d.

Next, the secondary coating layer 30 is one typically used as a coating of an optical fiber and absorbs ultraviolet light. The secondary coating layer 30 may be made of an ultraviolet curing resin with an absorptance of about 10% or less to ultraviolet light having a wavelength of 244 nm, and is preferably made of an epoxy-based or urethane acrylate-based, ultraviolet curing resin.

The secondary coating layer 30 preferably has a thickness of 51.5 μm to 61.5 μm. If the thickness is less than 51.5 μm, the secondary coating layer 30 fails to provide sufficiently strength to the covered fiber 40; if the thickness is in excess of 61.5 μm, the secondary coating layer 30 is difficult to remove in the formation of the gratings 4a to 4d in the optical fiber-type optical elements 10a to 10d and makes the covered fiber 40 difficult to handle.

The ultraviolet curing resin constituting the secondary coating layer 30 has a transmittance of about 10% or less to ultraviolet light having a wavelength of 244 nm. Therefore, the ultraviolet curing resin does not require reduced manufacturing speed as in a method of manufacturing an optical fiber which contains in its coating layer only a conventional ultraviolet curing resin which has a high transmittance to ultraviolet light. The ultraviolet curing resin constituting the secondary coating layer 30 thus enables manufacture of the optical fiber-type optical elements 10a to 10d at an ordinary manufacturing speed. The secondary coating layer 30, as mentioned above, has a low transmittance to ultraviolet light and therefore needs to be removed when the FG is manufactured. However, the secondary coating layer 30 is readily removable.

For example, by irradiating the secondary coating layer 30 with pulsed ultraviolet light, the ultraviolet curing resin absorbs the ultraviolet light and heats up. The ultraviolet curing resin is burnt and readily ablated by the heat. The secondary coating layer 30 can be readily removed in this manner. The irradiation with ultraviolet light can be carried out by, for example, irradiating the secondary coating layer 30 with pulsed excimer laser or like ultraviolet light. Since the secondary coating layer 30 is removable by irradiation with ultraviolet light in this manner, the optical fiber-type optical elements 10a to 10d is not damaged. Furthermore, the removal of the secondary coating layer 30 can also be readily carried out by using an ultraviolet light radiation device and hence does not require a special device to be prepared in FG manufacture.

In addition, the covered fiber 40 from which the secondary coating layer 30 has been removed has its surface covered with the primary coating layer 20 which has a high transmittance to ultraviolet light. Therefore, it is possible to form the gratings 4a to 4d by irradiating the surface with ultraviolet light from above the primary coating layer 20. Thus, for such a covered fiber 40, no micro cracks develop in the optical fiber-type optical elements 10a to 10d in the formation of the gratings 4a to 4d. Therefore, the optical fiber-type optical elements 10a to 10d does not degrade in strength after the formation of the gratings 4a to 4d.

The following will describe in detail how the gratings 4a to 4d are formed. First, the optical fiber-type optical elements 10a to 10d is stored 5 days under a 100 atm, 50° C. hydrogen atmosphere so as to increase the sensitivity of the optical fiber-type optical elements 10a to 10d to ultraviolet light (hydrogen treatment step).

Next, as shown in (b) of FIG. 5 and (c) of FIG. 5, pulsed ultraviolet laser is shone to a mid-part of the covered fiber 40 where a grating is to be formed, in order to remove the secondary coating layer 30. The ultraviolet light radiation device used in this step may be a device that is similar to the one used for grating, including excimer laser, the third harmonic of Q-switched YAG (yttrium-aluminum garnet) laser, etc., as well as the second harmonic of argon gas laser (244 nm). In addition, the ultraviolet light preferably has a wavelength of 190 nm to 400 nm, an energy density of 0.5 mJ/mm$^2$ to 10.0 mJ/mm$^2$, and a pulse count of 10 Hz to 200 Hz per 10 sec to 1,000 sec.

Next, the covered fiber 40 from which the secondary coating layer 30 has been removed is irradiated with ultraviolet light (UV light) from above the primary coating layer 20, in order to form the gratings 4a to 4d in the optical fiber-type optical elements 10a to 10d. Long-period gratings 4a to 4d which function as long-period gratings may be formed using a scattering mask (not shown) which has slits formed at the same period as the gratings 4a to 4d are to be formed. In contrast, short-period gratings 4a to 4d which function as Bragg gratings may be formed using a phase mask 6 illustrated in (d) of FIG. 5 as shown in (d) of FIG. 5.

Note that (d) of FIG. 5 illustrates a part of the covered fiber 40 in (b) of FIG. 5 where the secondary coating layer 30 is removed, the part including a section 50 in which a grating is to be formed. In addition, the phase mask 6 has, on a side thereof, a plurality of gratings 7 formed at a predetermined period (310 nm).

To form a short-period grating 4a (or 4b to 4d) which functions as a Bragg grating, the covered fiber 40 is irradiated on its side face with the second harmonic of argon ion laser (ultraviolet light with a wavelength of 244 nm) via the phase mask 6 from an ultraviolet light radiation device (not shown) as shown in (d) of FIG. 5.

Note that ultraviolet light having a wavelength of 244 nm is shone about 20 minutes in the case of the long-period grating 4a (or 4b to 4d) and about 10 minutes in the case of a Bragg grating 4b (or 4a, 4c, 4d).

Note that when a Bragg grating is to be formed, ultraviolet light is diffracted by the gratings 7 of the phase mask 6 so that +1-order diffracted light and −1-order diffracted light interfere and produce an interference stripe pattern. In addition, due to photorefractive effect, the photosensitive layers 3a to 3d of the optical fiber-type optical elements 10a to 10d change their refractive indices in the part where the interference stripe pattern is produced. Note that the diffracted light of the ultraviolet light may be second or higher order diffracted light.

In addition, the gratings 4a to 4d may be slanted gratings. A slanted grating is capable of strongly coupling to radiation mode due to its angle converting effect. The slanted grating can be formed by, for example, irradiating the covered fiber 40 with ultraviolet light via the phase mask 6 in making use of photorefractive effect, with the periodical gratings 7 on a side of the phase mask 6 shown in (d) of FIG. 5 being disposed so as to be oblique to an axial direction of the covered fiber 40.

A FG having a grating 4a to 4d formed in the light-guiding direction of the optical fiber-type optical element 10a to 10d can be manufactured by the process described above. If the grating is formed with a short period, the resultant grating is a fiber Bragg grating; if the grating is formed with a long period, the resultant grating is a long-period fiber grating. Thereafter, a 120° C. heat treatment is carried out for about 12 hours as a dehydrogenation step.

[6. Fifth Embodiment]

Figure 6:
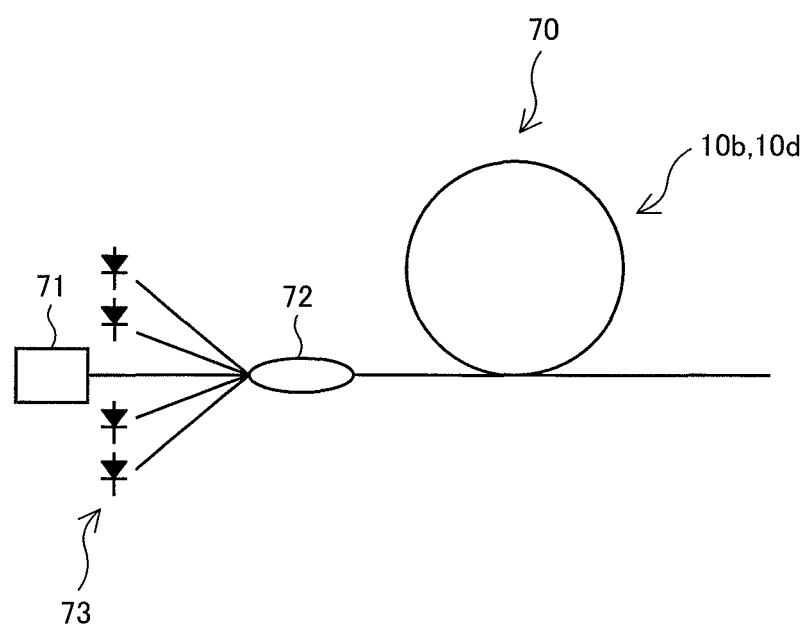
FIG. 6 is a block diagram representing an arrangement of a fiber laser which is another embodiment of the present invention.

Next, an arrangement of a fiber laser 70, which is another embodiment of the present invention, will be described in reference to FIG. 6. FIG. 6 is a block diagram illustrating an arrangement of the fiber laser 70. The fiber laser 70 in accordance with the present embodiment includes the optical fiber-type optical element 10b of the second embodiment or the optical fiber-type optical element 10d of the fourth embodiment which functions as a Bragg grating.

As illustrated in FIG. 6, the fiber laser 70 includes the optical fiber-type optical element 10b or 10d, a pulse light source 71, a pump combiner 72, and a total of four LDs 73.

The pulse light source 71 emits pulses (signal light) having, for example, a pulse width of 50 ns, a peak power of 60 W, a repetition frequency of 20 kHz, and a wavelength of 1.06 μm so that the pulses enter the core section 1 of the optical fiber-type optical element 10b or 10d via the pump combiner 72.

In addition, the LDs 73 emit excitation light (laser light) having a wavelength of 980 nm so that the excitation light enters the first cladding section 2 and the photosensitive layer 3b or 3d of the optical fiber-type optical element 10b or 10d via the pump combiner 72.

In the present embodiment, the signal light which enters the core section 1 and the excitation light which enters the first cladding section 2 and the photosensitive layer 3b or 3d enter the optical fiber-type optical element 10b or 10d via the pump combiner 72.

The optical fiber-type optical element 10b or 10d has the double cladding structure shown in FIG. 2. Therefore, the core 1 functions as a waveguide in which the signal light propagates, whereas the first cladding 2 and the photosensitive layer 3b or 3d functions as a waveguide (inner cladding) in which the excitation light propagates. The second cladding 5 is used to confine the excitation light in the inner cladding. In the optical fiber-type optical element 10b or 10d, the grating 4b or 4d is formed in the photosensitive layer 3b or 3d in which the excitation light propagates, on an end opposite the pump combiner 72. Accordingly, (part of) residual excitation light which has not been used to excite ytterbium is reflected on the end opposite the pump combiner 72, so that the residual excitation light can be reused in ytterbium excitation.

[7. Sixth Embodiment]

Next, an arrangement of an LD module 80, which is another embodiment of the present invention, will be described in reference to (a) of FIG. 7 and (b) of FIG. 7. The LD module 80 in accordance with the present embodiment includes the fiber-type optical element 10a (or 10c) in accordance with the first embodiment which functions as a long-period fiber grating.

Figure 7:
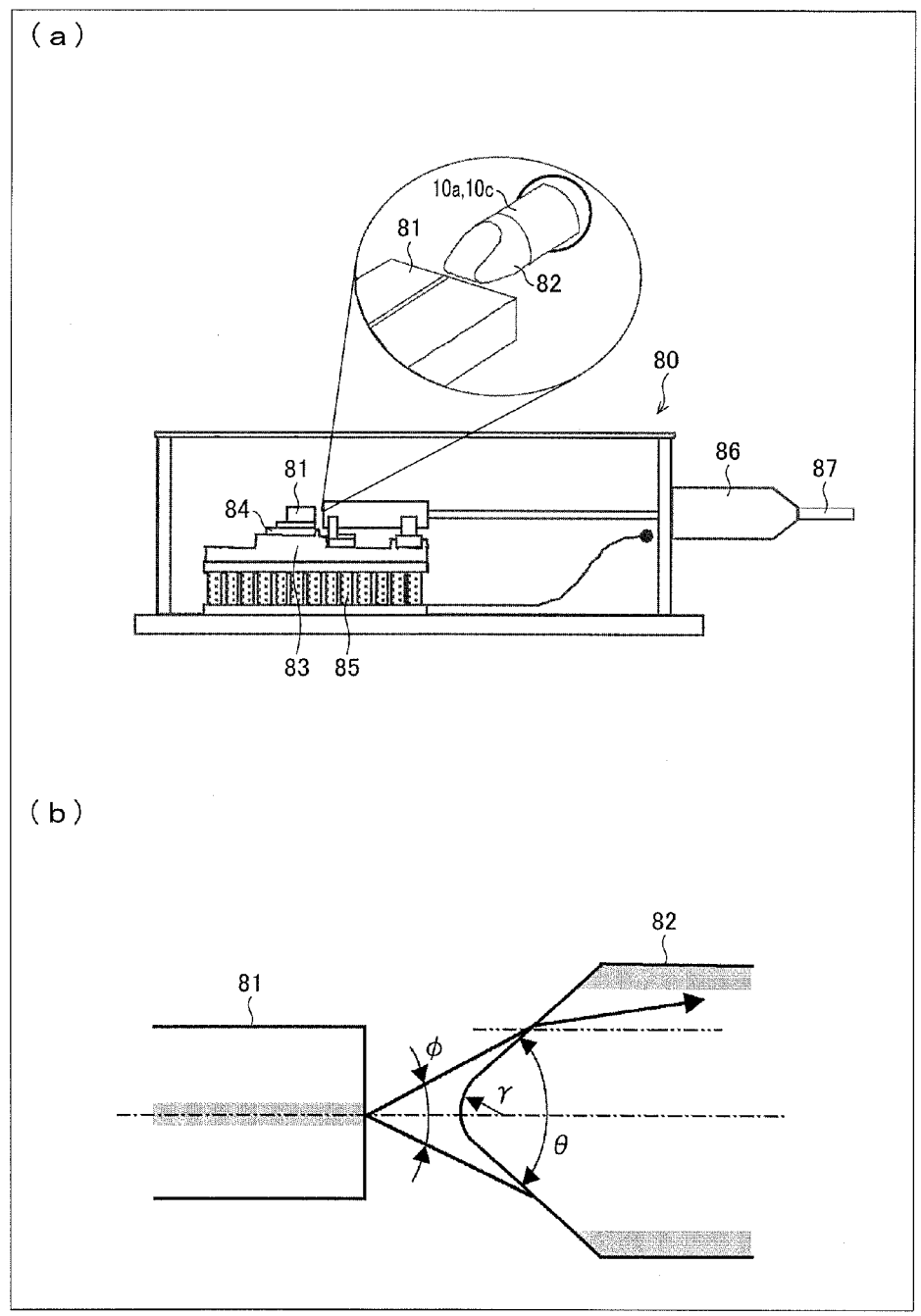
FIG. 7 is a drawing representing an arrangement of an LD module which is another embodiment of the present invention. (a) of FIG. 7 illustrates an exemplary cross-sectional (side cross-sectional) structure of the LD module. (b) of FIG. 7 illustrates an exemplary cross-sectional (side cross-sectional) structure of a lens section of a lensed fiber.

(a) of FIG. 7 is a block diagram illustrating an arrangement of the LD module 80, (b) of FIG. 7 is a schematic drawing illustrating an exemplary structure for a lens section of the optical fiber-type optical element 10a or 10c (fabricated into a lensed fiber).

As shown in (a) of FIG. 7, the LD module 80 includes a high power LD 81, a lens section 82, a base 83, a submount 84, a Peltier element 85, a ferrule 86, and a laser light exit 87.

The high power LD 81 has an output power of about 10 W and an output light (laser light) wavelength of 915 nm.

The high power LD 81 is junction down-bonded to the submount 84 so as to improve its heat discharge property.

The lens section 82 is a part, of one of end faces of the optical fiber-type optical element 10a or 10c, which is fabricated into a lens shape. As shown in (b) of FIG. 7, the lens section 82 has a wedge angle θ of about 115° and a lens diameter r of about 15 μm. Hence, the lens section 82 efficiently converges laser light emitted from the high power LD 81 to the core section 1 of the optical fiber-type optical element 10a or 10c.

In addition, the optical fiber-type optical element 10a or 10c is fixed to the base 83 by YAG welding after precise aligning. Below the base 83 is there attached the Peltier element 85 (thermoelectric cooler or TEC) to enable to keep temperature of the high power LD 81 at a constant level.

Note that the ferrule 86 is for fixing an light-emitting end of the optical fiber-type optical element 10a or 10c and that laser light is emitted from the laser light exit 87.

A part of the optical fiber-type optical element 10a or 10c of the present embodiment which runs through the ferrule 86 is coated with metal. Therefore, it is desirable to cause cladding-mode light to radiate out of the optical fiber-type optical element 10a or 10c before the cladding-mode light reaches the metal-coated part so as to prevent the metal coating from excess heating. Accordingly, in the example shown in the present embodiment, the grating 4a or 4c in the photosensitive layer 3a or 3c is formed, as a slanted grating with a slant angle of 10°, about 2 cm in the light-guiding direction from a position about 2.5 cm away from the lens section 82. Note that the grating 4a or 4c has a period PL of about 750 nm. In addition, a slant angle is an angle between a grating direction (direction perpendicular to a plane where a refractive index increases) and an axial direction of the optical fiber-type optical element 10a or 10c.

In addition, the present invention may be described as follows.

An optical fiber-type optical element of the present invention is preferably such that the photosensitive layer is present in a region where a light-guiding mode in which a larger light amplitude part is mainly within the core section has a light intensity which is lower than $1/e^2$ times a maximum intensity. In addition, the cladding section may have a thickness of greater than or equal to 5 μm.

According to the arrangement, in the optical fiber-type optical element of the present invention, (i) most of an amplitude of a light-guiding mode in which a larger light amplitude part is mainly within the core section is present in a region where a light intensity is yet to reach $1/e^2$ times a maximum intensity (or in a range where the cladding section has a thickness less than or equal to 5 μm), and (ii) no amplitude of core-mode light is present in a region where the light intensity is lower than $1/e^2$ times a maximum intensity (or a range where the cladding section has a thickness greater than or equal to 5 μm). Therefore, the optical fiber-type optical element of the present invention does not affect the core-mode light and can restrain cladding-mode light from propagating unaffected.

Note that in the case of a single mode, a diameter of a region where the light intensity is equal to $1/e^2$ times a maximum intensity is a so-called mode field diameter (MFD).

From the description above, the core section and the photosensitive layer are separated by a sufficient distance. Therefore, it is possible to prevent the refractive index grating from acting as an external disturbance to the core-mode light.

In addition, the optical fiber-type optical element of the present invention may include another cladding section provided so as to extend in the light-guiding direction and peripherally enclose the photosensitive layer.

According to the arrangement, the present invention is applicable to an optical fiber-type optical element which includes a plurality of cladding sections.

In the following description, when there are more than one cladding section, the cladding sections will be referred to, for example, starting with the one closest to the core section, as a first cladding section, a second cladding section, . . . , an L-th cladding section, . . . , and an N-th cladding section (L and N are natural numbers and L<N).

In this situation, the photosensitive layer may be disposed close to an outer circumference of a select one of the first cladding section through the N-th cladding section.

For example, when cladding-mode light in the L-th cladding section is to be selectively coupled or reflected into another mode (including radiation mode), the photosensitive layer may be dispose close to an outer circumference of the L-th cladding section.

In addition, the optical fiber-type optical element of the present invention may be such that the refractive index grating is a long-period grating which couples a light-guiding mode having a predetermined wavelength into a radiation mode or a Bragg grating which reflects a light-guiding mode having a predetermined wavelength.

The refractive index grating, when it is a long-period fiber grating (hereinafter, a "long-period grating"), is capable of coupling a light-guiding mode having a predetermined wavelength into a radiation mode.

In addition, the refractive index grating, when it is a short-period fiber grating or a fiber Bragg grating (hereinafter, a "Bragg grating"), is capable of reflecting a light-guiding mode having a predetermined wavelength.

In addition, the optical fiber-type optical element of the present invention may be such that the Bragg grating is a slanted grating.

A slanted grating is capable of strongly coupling a light-guiding mode having a predetermined wavelength into a radiation mode due to its angle converting effect.

In addition, a laser diode module of the present invention may be a laser diode module which includes any one of the foregoing optical fiber-type optical elements.

According to the arrangement, for example, by forming a refractive index grating as a long-period grating at a desired position with respect to the light-guiding direction, it is possible to couple unwanted light or excess light into a radiation mode in the cladding section at a desired position. This brings about effects, such as, an effect that a coating section, a metal coating section, etc. which covers the optical fiber-type optical element is prevented from being heated to high temperature and damaged.

In addition, a fiber laser of the present invention may be a fiber laser which includes any one of the optical fiber-type optical elements.

According to the arrangement, for example, formation of a refractive index grating as a Bragg grating brings about effects, such as, an effect that part of laser light that has not contributed to amplification of core-mode light is reflected at a desired position for contribution to amplification of core-mode light.

[Remarks]

The present invention is not limited to the description of the embodiments above, but may be altered by a skilled person within the scope of the claims. An embodiment based on a proper combination of technical means disclosed in different embodiments is encompassed in the technical scope of the present invention.

Industrial Applicability

The present invention is applicable to an optical fiber-type optical element which is used in a fiber laser, an LD module, etc. The present invention is especially suitably used in an optical fiber-type optical element, a fiber laser, an LD module, etc. which is required to produce low loss in a light-guiding mode in which a larger amplitude part is mainly within a core section.

| Reference Signs List | |
|---|---|
| 1 | Core Section |
| 2 | First Cladding Section (Cladding Section) |
| 3a, 3b, 3c, 3d | Photosensitive Layer |
| 4a, 4b, 4c, 4d | Grating (Refractive Index Grating, Long-period Grating, Bragg Grating) |
| 5 | Second Cladding Section (Another Cladding Section) |
| 6 | Phase Mask |
| 7 | Diffraction Grating |
| 10a, 10b, 10c, 10d | Optical Fiber-type Optical Element |
| 20 | Primary Coating Layer |
| 30 | Secondary Coating Layer |
| 40 | Covered Fiber |
| 50 | Grating Form Section |
| 70 | Fiber Laser |
| 71 | Pulse Light Source |
| 72 | Pump Combiner |
| 73 | LD |
| 80 | LD Module (Laser Diode Module) |
| 81 | High Power LD |
| 82 | Lens Section |
| 83 | Base |
| 84 | Submount |
| 85 | Peltier Element |
| 86 | Ferrule |
| 87 | Laser Light Exit |
| d1 | Core Diameter |
| d2 | First Cladding Diameter |
| d3 | Photosensitive Layer Outer Diameter |
| d4 | Second Cladding Diameter |
| L1, L1' | Cladding-mode Light |
| L2 | Radiation Mode |
| L2' | Reflected Light |
| n, n1 to n4 | Refractive Index |
| PL, PS | Period |

The invention claimed is:

1. An optical fiber-type optical element, comprising:
a core section provided so as to extend in a light-guiding direction in which incident light propagates;
a photosensitive layer provided so as to extend in the light-guiding direction and peripherally enclose the core section, the photosensitive layer including a refractive index grating formed therein by irradiation with ultraviolet light having a predetermined wavelength; and
a cladding section provided between the core section and the photosensitive layer, the cladding section having a lower refractive index than the core section and a lower photosensitivity than the photosensitive layer, the photosensitivity being a property in which a refractive index changes in response to irradiation with the ultraviolet light,
wherein the core section has a lower photosensitivity than the photosensitive layer,
wherein the photosensitive layer is present in a region where a light-guiding mode in which a larger light amplitude part is mainly within the core section has a light intensity which is lower than $1/e^2$ times a maximum intensity,
wherein the optical fiber-type optical element is a multi-mode fiber, and
wherein the optical fiber-type optical element further comprises another cladding section provided so as to extend in the light-guiding direction and peripherally enclose the photosensitive layer.

2. The optical fiber-type optical element as set forth in claim 1, wherein the refractive index grating is a long-period grating which couples a light-guiding mode having a predetermined wavelength into a radiation mode.

3. The optical fiber-type optical element as set forth in claim 1, wherein the refractive index grating is a Bragg grating which reflects a light-guiding mode having a predetermined wavelength.

4. The optical fiber-type optical element as set forth in claim 3, wherein the Bragg grating is a slanted grating.

5. The optical fiber-type optical element as set forth in claim 1, wherein the cladding section has a thickness of greater than or equal to 5 μm.

6. A laser diode module, comprising the optical fiber-type optical element as set forth in claim 1.

7. The optical fiber-type optical element as set forth in claim 1, wherein the photosensitive layer has a higher refractive index than the cladding section.

8. A fiber laser, comprising the optical fiber-type optical element as set forth in claim 1.

* * * * *